US006579773B2

(12) United States Patent
Norström et al.

(10) Patent No.: US 6,579,773 B2
(45) Date of Patent: Jun. 17, 2003

(54) TRANSISTOR DEVICE AND FABRICATION METHOD THEREOF

(75) Inventors: Hans Norström, Solna (SE); Torkel Arnborg, Stockholm (SE); Ted Johansson, Djursholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/887,037

(22) Filed: Jun. 25, 2001

(65) Prior Publication Data

US 2001/0055893 A1 Dec. 27, 2001

(30) Foreign Application Priority Data

Jun. 26, 2000 (SE) .............................. 0002389

(51) Int. Cl.$^7$ ............................... H01L 21/331
(52) U.S. Cl. ............ 438/350; 438/309; 438/369; 438/370; 257/197; 257/592; 257/593
(58) Field of Search ................. 438/309, 350, 438/369, 370; 257/197, 592, 593

(56) References Cited

U.S. PATENT DOCUMENTS

| | | | | |
|---|---|---|---|---|
| 4,669,179 A | * | 6/1987 | Weinberg et al. | 148/DIG. 10 |
| 4,949,145 A | * | 8/1990 | Yano et al. | 257/370 |
| 5,444,285 A | * | 8/1995 | Robinson et al. | 257/378 |
| 5,698,459 A | | 12/1997 | Grubisich et al. | |
| 5,719,082 A | | 2/1998 | Violette | |
| 5,982,022 A | | 11/1999 | Violette | |
| 6,124,617 A | * | 9/2000 | Yoshihara et al. | 257/370 |
| 6,297,120 B1 | * | 10/2001 | Koiwa | 438/358 |

FOREIGN PATENT DOCUMENTS

| | | |
|---|---|---|
| DE | 19617030 A1 | 6/1997 |
| EP | 0962967 A1 | 8/1999 |

OTHER PUBLICATIONS

Campbell, S.A., "The Science and Engineering of Microelectronic Fabrication," 1996, Oxford University Press, p. 108.*

P. Palestri et al., "Optimization Guidelines for Epitaxial Collectors of Advanced BJT's with Improved Breakdown Voltage and Speed," *International Electron Devices Meeting Tech. Dig.* (1998), p. 741.

P. Palestri et al., "A Better Insight into the Performance of Silicon BJT's Featuring Highly Nonuniform Collector Doping Profiles," *IEEE Transactions on Electron Devices*, vol. 47, No. 5, (May 2000), pp. 1044–1051.

A. Schüppen et al., "Enhanced SiGe Heterojunction Bipolar Transistors with 160 GHz–$f_{max}$." *International Electron Devices Meeting Tech. Dig.* (1995), p. 743.

* cited by examiner

*Primary Examiner*—Amir Zarabian
*Assistant Examiner*—Jeff Vockrodt
(74) *Attorney, Agent, or Firm*—Burns, Doane, Swecker & Mathis, L.L.P.

(57) ABSTRACT

In the fabrication of a transistor device, particularly a low-voltage high-frequency transistor for use in mobile telecommunications, a method for improving the transistor performance and the high-frequency characteristics of the device is described. The method includes providing a semiconductor substrate (1) with an n-doped collector layer (5) surrounded by isolation areas (4), implanting antimony ions into the collector layer such that a thin highly n-doped layer (18) is formed in the uppermost portion of the collector layer, and forming a base on top of said thin highly n-doped layer (18).

22 Claims, 3 Drawing Sheets

TRANSISTOR DEVICE AND FABRICATION METHOD THEREOF

TECHNICAL FIELD OF THE INVENTION

The present invention generally relates to transistor devices, particularly low-voltage high-frequency transistors for use in mobile telecommunications.

More specifically, the invention relates to a simplified method for fabrication of a transistor device having an improved high-frequency performance, to the transistor device itself, and to an integrated circuit comprising such a transistor device.

DESCRIPTION OF RELATED ART

Bipolar integrated circuits play a major role for modern telecommunication systems. The circuits are used mostly for analog functions, e.g. for switching currents and voltages, and for high-frequency radio functions (mixers, amplifiers, detectors, etc.).

The speed of today's silicon bipolar junction transistors (BJT) with about 50 GHz $f_T$ (maximum transition frequency) is reaching its physical limitations because of the trade-off between the thickness and the resistivity of the base layer. By adding some germanium into the base of a conventional BJT, the high-frequency characteristics can be substantially improved. Such a device is a SiGe (silicon germanium) HBT (heterojunction bipolar transistor) structure. The layer structure is usually grown with MBE (Molecular Beam Epitaxy) or CVD (Chemical Vapor Deposition), but it is also possible to implant Ge into the Si to achieve a similar effect but with less control of the doping profile.

During the last years, SiGe HBT's have shown record high-frequency performance with respect to $f_T$ and $f_{max}$ (maximum oscillation frequency). For high-frequency applications, e.g. wireless communication, the SiGe HBT can be used to boost performance of existing double-polysilicon HF-IC's and BiCMOS technologies. There is, however, still an interest in improving the device's frequency characteristics, especially for devices where high current needs to be amplified at high frequencies.

The launcher concept for improving the transistor performance has been known for some time and were described more in detail in the publication "Optimization Guidelines for Epitaxial Collectors of Advanced BJT's with Improved Breakdown Voltages and Speed", P. Palestri, C. Fiegna, L. Selmi, G. A. M. Hurkx, J. W. Slotboom and E. Sangiorgi, International Electron Devices Meeting Tech. Dig., 1998, p. 741, and in "A Better Insight into the Performance of Silicon BJT's Featuring Highly Nonuniform Collector Doping Profiles", P. Palestri, C. Fiegna, L. Slemi, M. S. Peter, G. A. M. Hurkx, J. W. Slotboom, E. Sangiorgi, IEEE Transactions on Electron Devices, Vol. 47, No. 5, p. 1044, May 2000. The basic idea is to create a high field layer between the base and collector so thin that no scattering will take place and with such a high field that the carrier velocities are substantially increased. The thickness should be comparable to the mean free path between scattering and the doping levels substantially higher than the rest of the collector. Typical values for the thickness are 10–100 nm and for the doping levels $1 \times 10^{17}$–$1 \times 10^{20}$ cm$^{-3}$. If the proper values can be used, the breakdown voltage is almost unchanged and the device speed is increased.

Experimental confirmation of the launcher layer function was shown in a publication "Enhanced SiGe Heterojunction Bipolar Transistors with 160 GHz Fmax", A. Schtippen, U. Erben, A. Gruhle, H. Kibbel, H. Schumacher, U. König, International Electron Devices Meeting Tech. Dig. 1995, p. 743, where the performance of double-mesa type SiGe transistors were improved substantially and a record $f_{max}$ of 160 GHz was achieved.

The device structure used to show improved device performance with a double-mesa type SiGe transistor was grown with molecular beam epitaxy (MBE). Such a structure is not particularly suited for mass production or fabrication of large integrated circuits.

Such double-mesa type SiGe transistor comprising a collector launcher layer is also disclosed in the German patent application No. 196 17 030 A1.

SUMMARY OF THE INVENTION

A simplified fabrication method that can be applied for silicon/silicon germanium RF-IC bipolar transistors with minimum changes to the existing process flow is needed.

It is thus an object of the present invention to provide a method in the fabrication of a transistor device, particularly a transistor device for radio frequency applications, for forming a collector launcher layer in a simpler and more flexible way.

It is still a further object of the invention to provide such a method having increased integration flexibility and which is compatible with several technologies.

These objects among others are, according to one aspect of the invention, fulfilled by a method comprising the following steps:

providing a semiconductor substrate with an n-doped collector layer surrounded by isolation areas;

implanting antimony ions into the collector layer such that a thin highly n-doped layer is formed in the uppermost portion of said collector layer; and forming a base on top of said thin highly n-doped layer.

Preferably, a mask is placed on top of said substrate, said mask comprising an opening above said n-doped collector layer, wherein the antimony ions are implanted through said mask opening.

Furthermore, it is an object of the present invention to provide a semiconductor transistor device resulting from above-mentioned fabrication method.

According to a second aspect of the present invention there is thus provided a semiconductor transistor device comprising a thin antimony ion-implanted layer of high doping level between its collector and base.

Implanting antimony (Sb) at low-energy before depositing the base layers in an existing bipolar RF-IC process, and thus creating a collector-launcher layer under the base, substantially improves the transistor's high-frequency performance and current handling capabilities.

By using Sb, a thin highly doped layer can be created under the base because of the low projected range of Sb during ion implantation. Since Sb also has a low diffusion coefficient, the thin layer can withstand the thermal heat cycles of a normal process flow, without degrading the sharp doping profile of the layer.

Further advantages and characteristics of the present invention will be disclosed in the following detailed description of embodiments.

BRIEF DESCRIPTION OF THE DRAWINGS

The present invention will become better understood from the detailed description of embodiments of the present invention given hereinbelow and the accompanying FIGS. 1–6, which are given by way of illustration only and thus are not limitative of the invention.

DETAILED DESCRIPTION OF EMBODIMENTS

In the following description, for purposes of explanation and not limitation, specific details are set forth, such as particular hardware, applications, techniques, etc., in order to provide a thorough understanding of the present invention. However, it will be apparent to one skilled in the art that the present invention may be practiced in other embodiments that depart from these specific details. In other instances, detailed descriptions of well-known methods, protocols, devices, and circuits are omitted so as not to obscure the description of the present invention with unnecessary details.

Figure 1:
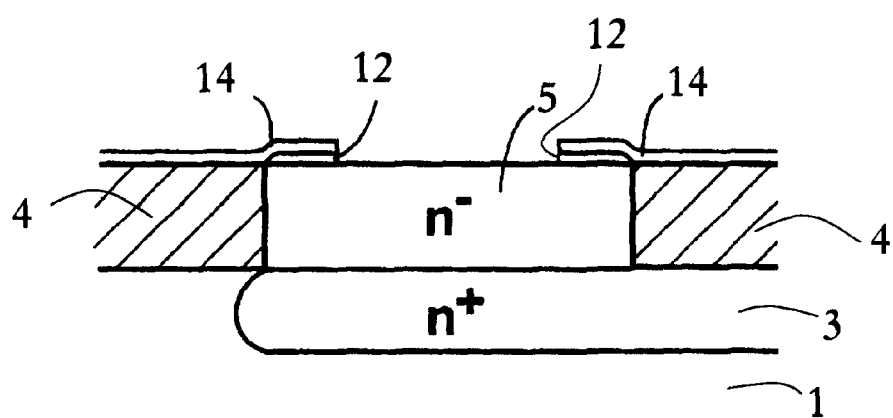
FIGS. 1–3 are highly enlarged cross-sectional views of a portion of a semiconductor structure during processing according to the present invention.
Figure 2:
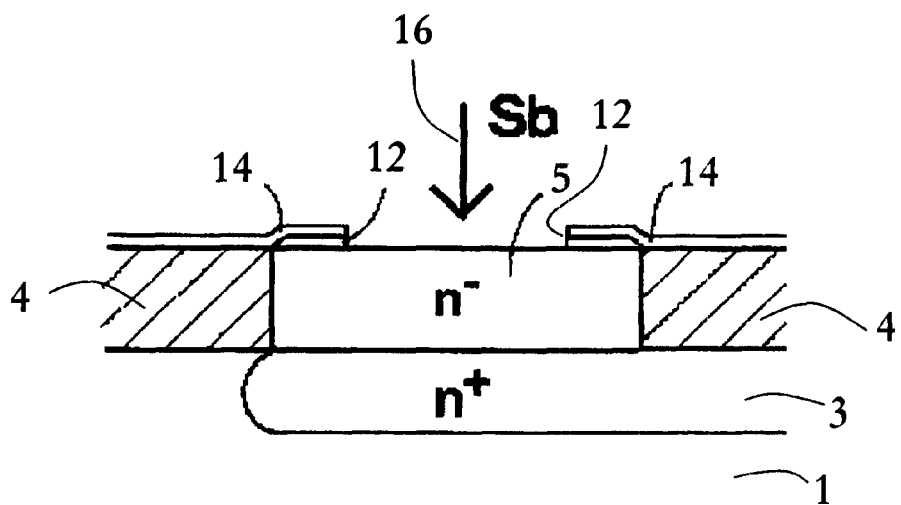
Figure 3:
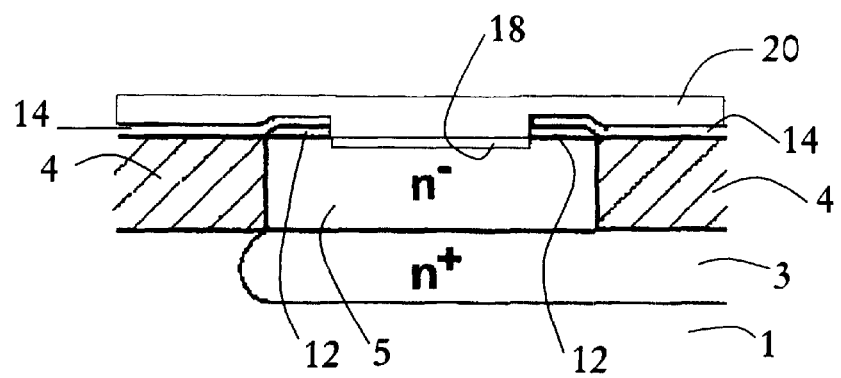

With reference to FIGS. 1–3, an inventive embodiment of a process sequence, which includes formation of an ion-implanted launcher layer, will be described.

Processing follows a common process flow for creating bipolar/BiCMOS integrated circuits with an epitaxially grown base, possibly also including SiGe in the base, incidentally. Hence, a substrate 1 is doped to $n^+$ to form a buried collector 3 of an npn-device. On top of buried collector 3, an isolated $n^-$ doped collector layer 5 is formed by the aid of LOCOS (Local Oxidation) or STI (Shallow Trench Isolation) 4.

On top of the collector 5 and the isolation areas 4 a thermal oxide 12, typically 100–300 Å, is grown. Thereafter, 100–300 Å of silicon nitride 14 is typically deposited on top of the oxide 12 by CVD. An E/B-opening mask (typically with a dimension of around 1 $\mu$) is patterned using photo resist, whereafter the nitride and the thermal oxide is dry-etched, thus defining an E/B-window. Subsequently, the remaining photo resist is removed. A resulting structure is illustrated in FIG. 1.

With reference now to FIG. 2, antimony Sb ions are ion-implanted into collector layer 5 within the E/B-window, as schematically indicated by arrow 16, to form a shallow collector launcher layer.

Sb is in an n-dopant in silicon, has a heavy mass (122 g/mol, Si 28 g/mol), which makes it suitable for creating shallow doping profiles, and has a very low thermal diffusion coefficient, which makes it insensitive to subsequent annealing. A low-energy (typically 5–10 keV), low dose (typically 1e12–1e13 cm$^{-2}$) Sb implantation is made to create a highly n-doped surface concentration, which will form the collector launcher layer.

A short high-temperature anneal (>600° C.) restores the crystal properties of the collector layer. This anneal can be made in a conventional furnace, or using a Rapid-Thermal Anneal (RTA) or be part of the pre-bake that is commonly made before depositing the Si/SiGe multilayer structure, which will form the base of the NPN transistor. The launcher layer is schematically indicated by reference numeral 18 in FIG. 3.

The processing is continued with epitaxial deposition of silicon for the base. Thus, approximately 2000 Å polysilicon 20 for the extrinsic base contact is deposited. The extrinsic base is doped by implanting B or $BF_2$ at low energy. Instead of layer 20 a multilayer structure of Si and/or Si/SiGe may be formed.

The fabrication process then continues in a conventional way (not illustrated), e.g. by depositing 1000–2000 Å TEOS; defining an emitter opening; etching down the TEOS and the polysilicon 20 to the silicon surface; and growing a thin thermal oxide in the emitter opening prior to base implantation. Subsequently to base doping, in order to isolate the extrinsic base polysilicon 20 from the emitter polysilicon and to further reduce the emitter opening, approximately 2000 Å of nitride is conformally deposited, whereafter it is etched anisotropically, leaving nitride inside spacers at the inner walls of the emitter opening.

The processing continues by depositing the emitter polysilicon (typically 2000–3000 Å) followed by doping (typically implantation of arsenic at high dose), masking and dry-etching the emitter polysilicon. Further, annealing of the structure at high temperature during a short time activates the dopants and sets the doping profiles. Typically, RTA is used at $\geq 1000°$ C. during 10–30 seconds. Finally, sheet resistivity reduction by silicide formation and metallization follow.

The details of the collector contact formation are omitted here as it may be made in any conventional manner.

To validate the subject of the present invention high-frequency bipolar transistors with an antimony ion-implanted launcher layer were simulated and compared with conventional high-frequency bipolar transistors.

Figure 4:
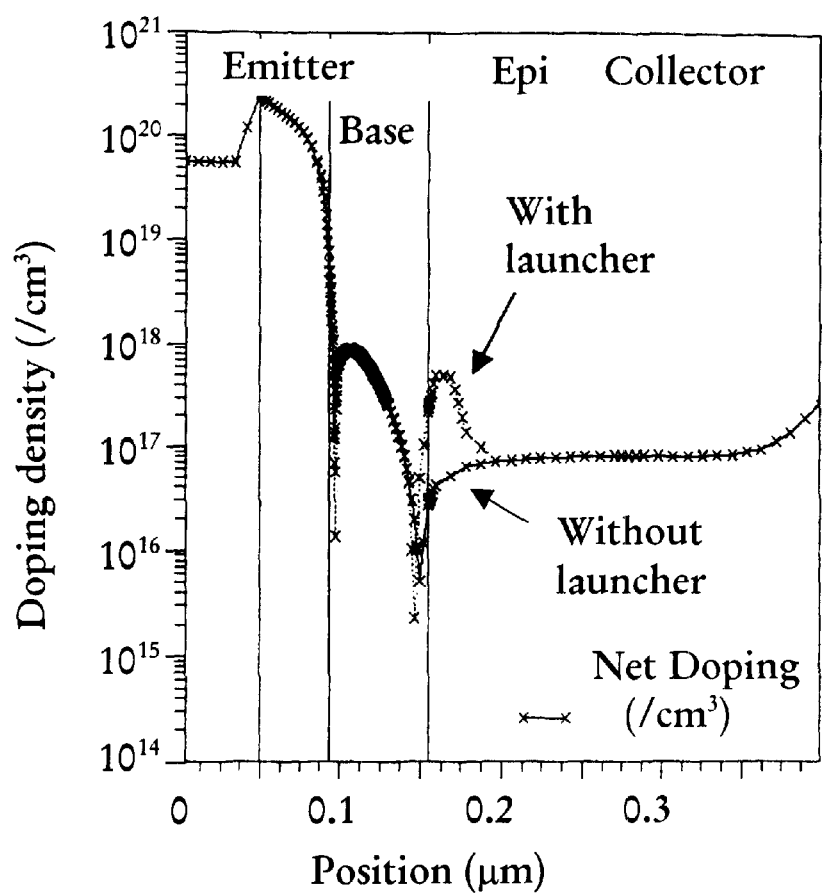
FIG. 4 is a diagram of the doping profiles for a bipolar transistor, wherein the difference as introduced by the inventive ion-implanted launcher layer is clearly indicated.

In FIG. 4 the doping profiles are shown for a high-speed bipolar transistor with an ion-implanted launcher layer and for a conventional high-speed bipolar transistor. The launcher layer is formed using the process sequence as described above.

Figure 5:
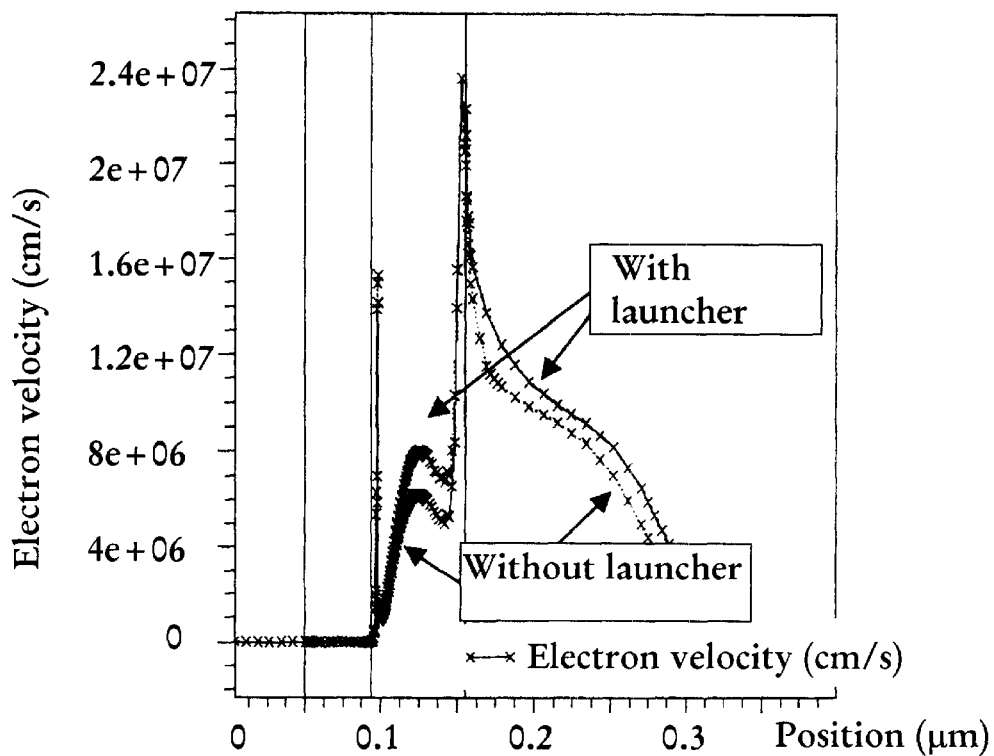
FIGS. 5–6 are diagrams of transistor performances for a transistor having the inventive ion-implanted launcher layer and for a conventional transistor, respectively.

In FIG. 5, electron velocities for a typical bias point applied to a transistor with a launcher layer and to a conventional transistor are shown. The velocity distribution is changed by the launcher. The peak value is increased, the base region velocity increases and the epicollector region velocity decreases. Note that there is a substantial velocity overshoot compared to the scattering limited velocity (approximately 1e7 cm/s) usually reached in large devices. The finally achieved collector current should be thought of as a weighted average value of these velocities. The main point for the present invention to work is that the region with high velocity/field region is so thin that no scattering occurs.

Figure 6:
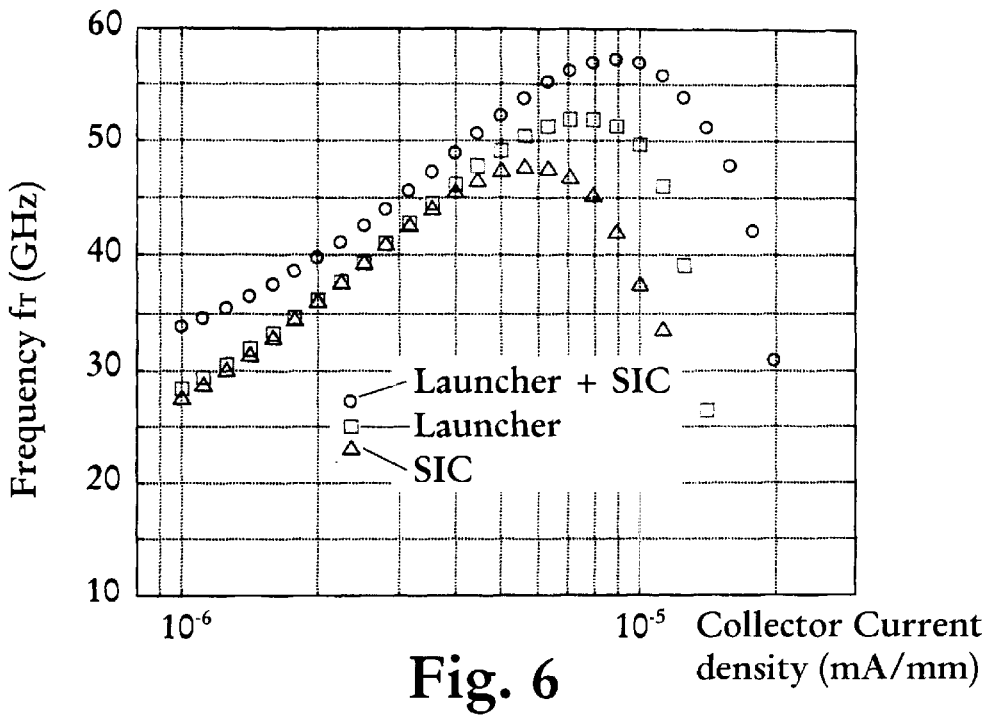

In FIG. 6 is demonstrated the improved RF performance with launcher layer and with launcher layer+SIC (secondary implanted collector, a common method for improving RF bipolar transistor performance). Both an increase in the maximum $f_T$ and in the high-frequency performance (current-gain fall-off at higher currents) are observed.

Advantages of the following invention comprises inter alia:

Improvement of bipolar RF-transistors HF-frequency and current handling capabilities.

Simple integration into existing fabrication flow of RF-ICs.

The bipolar RF-IC process schematically described above should be taken as an example only.

It shall be appreciated that Sb implantation may, according to the present invention, alternatively be performed into an open collector region, without the rest of the wafer being covered by oxide and nitride layers as depicted in the process above.

In yet an alternative version any kind of masking material is placed on top of the structure prior to Sb ion implantation in a further masking step. In such manner the lateral dimensions of the launcher layer may be well controlled.

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed:

1. In the fabrication of a transistor device, particularly a low voltage high frequency transistor or use in mobile telecommunications, a method for improving the transistor performance and the high frequency characteristics comprising the steps of:

providing a semiconductor substrate having an n-doped collector layer surrounded by isolation areas;

implanting antimony ions into said collector layer such that a thin highly n doped layer is formed in an uppermost portion of said collector layer; and forming an epitaxially grown base on top of said thin highly n doped layer.

2. The method as claimed in claim 1 wherein a low-energy and low dose of antimony is implanted to create a highly n-doped surface concentration.

3. The method as claimed in claim 2, wherein the low-energy dose of antimony is lower than 20 key.

4. The method as claimed in claim 2 wherein the low dose of antimony is between $1 \times 10^{11}$ and $1 \times 10^{13}$ cm$^{-2}$.

5. The method as claimed in claim 2 wherein the ion implantation increases the doping level by a factor of about 10–1000 within the thin highly n-doped layer.

6. The method as claimed in claim 2, wherein the low-energy dose of antimony is between 1 and 10 keV.

7. The method as claimed in claim 2, wherein the low-energy dose of antimony is lower than 15 keV.

8. The method as claimed in claim 1 wherein the antimony ion implantation is made to achieve a thickness of the thin highly n-doped layer of about 1–100 nm.

9. The method as claimed in claim 1 wherein the step of implanting is followed by a high-temperature anneal to restore the crystal properties of the collector layer.

10. The method as claimed in claim 9 wherein the anneal is performed at a temperature above 600° C. in a conventional furnace, or using a Rapid-Thermal Anneal (RTA).

11. The method as claimed in claim 1 wherein a secondary implanted collector (SIC) is formed.

12. The method as claimed in claim 1 wherein the base is formed as a boron in-situ doped, and epitaxially grown, Si layer structure.

13. The method as claimed in claim 1 wherein the base is formed as an Si/SiGe multilayer structure.

14. The method as claimed in claim 1 wherein a mask is placed on top of the substrate prior to the step of antimony ion implantation, said mask comprising an opening above said n-doped collector layer; and the antimony ions are implanted through said mask opening.

15. The method as claimed in claim 14 wherein the step of placing a mask comprises the steps of growing a thermal oxide on top of the collector layer; depositing a silicon nitride layer on top of the oxide; patterning and etching the silicon nitride and the oxide layers, thus defining the mask opening.

16. A transistor device, particularly a low-voltage high-frequency transistor for use in mobile telecommunications, wherein said transistor device is fabricated in accordance with the method as claimed in claim 1.

17. In the fabrication of a transistor device, particularly a low voltage high frequency transistor or use in mobile telecommunications, a method for improving the transistor performance and the high frequency characteristics comprising the steps of:

providing a semiconductor substrate having an n-doped collector layer surrounded by isolation areas;

implanting antimony ions into said collector layer such that a thin highly n-doped layer is formed in an uppermost portion of said collector layer; and forming a base on top of said thin highly n doped layer, wherein a low energy and low dose of antimony is implanted to create a highly n-doped surface concentration.

18. The method as claimed in claim 17, wherein the low energy dose of antimony is lower than 20 keV.

19. The method as claimed in claim 17, wherein the low dose of antimony is between $1 \times 10^{11}$ and $1 \times 10^{13}$ cm$^{-2}$.

20. The method as claimed in claim 17, wherein the ion implantation increases the doping level by a factor of about 10–1000 within the thin highly n-doped layer.

21. A method for forming a collector layer and a base layer for fabrication of a transistor device, the method comprising the steps of:

providing a semiconductor substrate having an n-doped collector layer surrounded by isolation areas;

implanting a low energy and low dose of antimony ions into the collector layer to form a thin highly n-doped layer in an upper most portion of the collector layer; and forming a base on top of the thin highly n-doped layer.

22. In the fabrication of a transistor device, particularly a low voltage high frequency transistor or use in mobile telecommunications, a method for improving the transistor performance and the high frequency characteristics comprising the steps of:

providing a semiconductor substrate having an n-doped collector layer surrounded by isolation areas;

implanting antimony ions into said collector layer such that a thin highly n doped layer is formed in an uppermost portion of said collector layer; and forming a base on top of said thin highly n doped layer, wherein the base is formed as an Si/SiGe multilayer structure.

* * * * *